(12) United States Patent
Lee et al.

(10) Patent No.: US 8,962,382 B2
(45) Date of Patent: *Feb. 24, 2015

(54) FABRICATION METHOD FOR ORGANIC LIGHT EMITTING DEVICE AND ORGANIC LIGHT EMITTING DEVICE FABRICATED BY THE SAME METHOD

(75) Inventors: Jung-Hyoung Lee, Daejeon (KR); Jung-Bum Kim, Daejeon (KR); Yun-Hye Hahm, Daejeon (KR)

(73) Assignee: LG Chem, Ltd., Seoul (KR)

(*) Notice: Subject to any disclaimer, the term of this patent is extended or adjusted under 35 U.S.C. 154(b) by 116 days.

This patent is subject to a terminal disclaimer.

(21) Appl. No.: 12/223,255

(22) PCT Filed: Feb. 2, 2007

(86) PCT No.: PCT/KR2007/000570
§ 371 (c)(1),
(2), (4) Date: Jul. 25, 2008

(87) PCT Pub. No.: WO2007/089117
PCT Pub. Date: Aug. 9, 2007

(65) Prior Publication Data
US 2010/0176378 A1    Jul. 15, 2010

Related U.S. Application Data

(60) Provisional application No. 60/782,288, filed on Mar. 15, 2006.

(30) Foreign Application Priority Data

Feb. 3, 2006 (KR) .................. 10-2006-0010722

(51) Int. Cl.
*H01L 51/40* (2006.01)
*H05B 33/26* (2006.01)
(Continued)

(52) U.S. Cl.
CPC ............... *H05B 33/14* (2013.01); *H05B 33/26* (2013.01); *H01L 51/5092* (2013.01); *H01L 51/5088* (2013.01); *H05B 33/22* (2013.01)
USPC ............................................. 438/99; 438/22

(58) Field of Classification Search
CPC ......................... H01L 51/0001; H01L 51/56
USPC ............ 438/99, 22; 257/E51.08, 40, E51.001
See application file for complete search history.

(56) References Cited

U.S. PATENT DOCUMENTS 6,255,774 B1 * 7/2001 Pichler ......................... 313/504
6,946,319 B2 * 9/2005 Stegamat et al. ............. 438/104
(Continued)

FOREIGN PATENT DOCUMENTS

CN      1108730      5/2003
CN      1481656      3/2004
(Continued)

*Primary Examiner* — Yu-Hsi D Sun
(74) *Attorney, Agent, or Firm* — McKenna Long & Aldridge, LLP (57) ABSTRACT

The present invention relates to a method for producing an organic light emitting device, comprising a step of sequentially forming on a substrate a first electrode formed of a metal, one or more organic material layers including a light emitting layer, and a second electrode, which comprises a step of forming a layer on the first electrode using a metal having the higher oxidation rate than the first electrode before forming the organic material layer, and to an organic light emitting device produced by the same.

3 Claims, 4 Drawing Sheets

(51) Int. Cl.
*H01L 51/50* (2006.01)
*H05B 33/14* (2006.01)
*H05B 33/22* (2006.01)

(56) References Cited

U.S. PATENT DOCUMENTS

2001/0009154 A1* 7/2001 Nguyen et al. .................... 134/1
2003/0022438 A1* 1/2003 Callaway et al. ............. 438/252
2004/0021414 A1 2/2004 Hanawa et al.
2004/0245919 A1 12/2004 Kim
2005/0123793 A1 6/2005 Thompson et al.
2005/0208330 A1 9/2005 Raychaudhuri et al.
2006/0187213 A1* 8/2006 Su ................................. 345/173

FOREIGN PATENT DOCUMENTS

JP 08-124679 5/1996
WO WO 98/10621 3/1998

* cited by examiner

FABRICATION METHOD FOR ORGANIC LIGHT EMITTING DEVICE AND ORGANIC LIGHT EMITTING DEVICE FABRICATED BY THE SAME METHOD

This application is the national phase application of International Application Number PCT/KR2007/000570 filed on Feb. 2, 2007, and claims the benefit of U.S. Provisional Application No. 60/782,288 filed on Mar. 15, 2006 and Korean Application No. 10-2006-0010722 filed on Feb. 3, 2006, all of which are hereby incorporated by reference as if fully set forth herein.

TECHNICAL FIELD

The present invention relates to a method for producing an organic light emitting device and an organic light emitting device produced by the same. Specifically, the present invention relates to a method for producing an organic light emitting device and an organic light emitting device produced by the same, which can reduce or remove a native oxide layer formed on the surface of electrode formed of a metal to improve an electron or hole injecting efficiency as well as a light emitting property and lifetime characteristics during the production process of an organic light emitting device.

This application claims priority benefits from Korean Patent Application No. 10-2006-0010722, filed on Feb. 3, 2006 in the Korean Intellectual Property Office, and from U.S. Provisional Patent Application No. 60/782,288, filed on Mar. 15, 2006 in the United States Patent and Trademark Office, the entire contents of which are each fully incorporated herein by reference.

BACKGROUND ART

In general, the term organic light emitting phenomenon refers to a phenomenon in which electric energy is converted to light energy by means of an organic material. The organic light emitting device (OLED) using the organic light emitting phenomenon has a structure usually comprising an anode, a cathode, and an organic material layer interposed therebetween. Herein, the organic material layer may be mostly formed in a multilayer structure comprising the layers consisting of different materials, for example, a hole injecting layer, a hole transporting layer, a light emitting layer, an electron transporting layer, and an electron injecting layer, in order to improve efficiency and stability of the organic light emitting device. In the organic light emitting device having such a structure, when a voltage is applied between two electrodes, holes from the anode and electrons from a cathode are injected into the organic material layer, the holes and the electrons injected are combined together to form excitons. Further, when the excitons drop to a ground state, light is emitted. Such the organic light emitting device is known to have characteristics such as self-luminescence, high luminance, high efficiency, low driving voltage, wide viewing angle, high contrast and high-speed response.

Various types of an organic light emitting device are disclosed in the related art, they can be used for different uses. The organic light emitting devices are commonly categorized as a top emission type organic light emitting device, a bottom emission type organic light emitting device and a dual emission type organic light emitting device.

In the case of using a bottom emission type organic light emitting device in the active matrix display, a thin film transistor (TFT) is disposed in front of light emitting source to reduce the aperture ratio of the display. The problem comes to be more serious in the case of producing a more delicate display which needs a large number of TFT. A bottom emission type organic light emitting device, in general, has an aperture ratio of less than 40%. For example, a 14 inch WXGA TFT display has an aperture ratio, which is estimated, of less than 20%. Such a low aperture ratio deteriorates the power consumption for operating OLED and its lifetime.

The above problems can be solved by using a top emission type organic light emitting device. In the top emission type organic light emitting device, the electrode not in contact with a lower substrate, that is, a top electrode, is substantially transparent in the range of visible ray. The transparent material for forming a top electrode in the top emission type organic light emitting device, for example, is a conductive oxide such as IZO (indium zinc oxide) or ITO (indium tin oxide). On the other hand, the electrode in contact with a substrate is usually formed of a metal. A dual emission type organic light emitting device also has a transparent top electrode in the same as a top emission type organic light emitting device.

Figure 1:
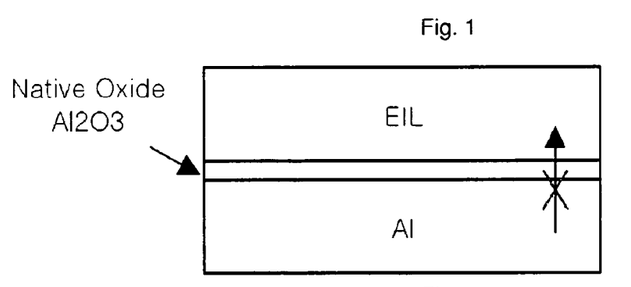
FIG. 1 illustrates a cross section of the lower structure of a top emission type organic light emitting device having the conventional reverse structure comprising an oxide layer on a metal electrode.
Figure 2:
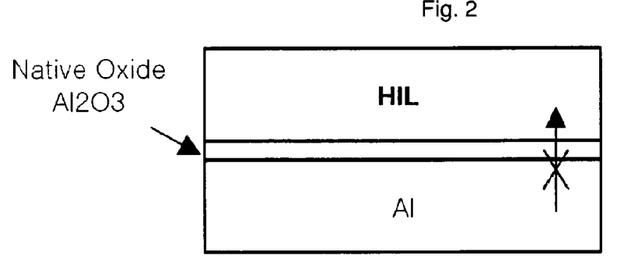
FIG. 2 illustrates a cross section of the lower structure of a top emission type organic light emitting device having the conventional forward structure comprising an oxide layer on a metal electrode.

FIGS. 1 and 2 each illustrate the general structure of the lower portion in an organic light emitting device having a reverse structure and a forward structure. As shown in FIGS. 1 and 2, on manufacturing a top emission type organic light emitting device, the deposition of a metal electrode on a substrate makes undesirably a native oxide layer on the metal electrode. In particular, in the production process of an organic light emitting device, a native oxide layer is formed on a metal electrode by exposing to the external moisture and oxygen during patterning the metal electrode using technology such as a photolithography and an etching process.

The native oxide layer disrupts the properties of the metal electrode, that is an electron injecting property in FIG. 1 and a hole injecting property in FIG. 2, thereby deteriorating the efficiency and luminance of the organic light emitting device.

One of the methods to prevent the native oxide layer from forming on the metal electrode is a method that an organic material layer can be formed in situ on the deposited metal electrode. In the method, the metal electrode is not exposed to air. Therefore, the oxide layer is not formed on the metal electrode. However, it must be performed under vacuum, thereby requiring a high cost and a complicated process. Further, the raw material suppliers often supply a substrate, on which a metal electrode is deposited, in exposing to air, before deposition of an organic material.

Accordingly, despite the presence of a native oxide layer being formed on the metal electrode, the development for a top emission type organic light emitting device, which has the improved electron injecting or hole injecting property, and a method for producing the same has been needed.

DISCLOSURE OF INVENTION

Technical Problem

Therefore, it is an object of the present invention to provide a method for producing an organic light emitting device and an organic light emitting device produced by the same, in which a native oxide layer formed on a metal electrode is reduced or removed to improve light emitting properties such as the electron or hole injecting property of the metal electrode and lifetime characteristics

Technical Solution

In order to achieve the above-described objects, the present invention provides a method for producing an organic light emitting device, comprising a step of sequentially forming on a substrate a first electrode formed of a metal, one or more organic material layers including a light emitting layer, and a second electrode, which comprises a step of forming a layer on the first electrode using a metal having the higher oxidation rate than the first electrode before forming the organic material layer.

Further, the present invention provides an organic light emitting device comprising a first electrode formed of a metal, one or more organic material layers including a light emitting layer, and a second electrode, each sequentially stacked therein, and further comprising a layer, in between the first electrode and the organic material layer, formed by using a metal having the higher oxidation rate than the first electrode.

Advantageous Effects

As described above, in the present invention, upon producing an organic light emitting device, a layer is formed on a metal electrode using a metal having the higher oxidation rate than the electrode without any additional process such as dry etching, effectively to reduce or remove a native oxide layer formed on a metal electrode, thereby improving electron or hole injecting property of the electrode to improve the properties such as hole injecting efficiency, low driving voltage and lifetime

BEST MODE FOR CARRYING OUT THE INVENTION

Hereinafter, the present invention will be described in detail.

The method for producing the organic light emitting device according to the present invention comprises a step of sequentially forming on a substrate a first electrode formed of a metal, one or more organic material layers including a light emitting layer, and a second electrode, and further comprises a step of forming a layer on the first electrode using a metal having the higher oxidation rate than the first electrode before forming the organic material layer. Herein, in the step of forming a layer on the first electrode using a metal having the higher oxidation rate than the first electrode, the material forming the layer is a metal itself having the higher oxidation rate than the first electrode, regardless of a change in the shape of the layer due to an oxidation-reduction reaction even after forming.

Upon producing the organic light emitting device, a native oxide layer, for example, aluminum oxide film ($Al_2O_3$) layer can be formed on a first electrode by exposing to air during/after patterning the first electrode. Consequently, it becomes difficult to operate the organic light emitting device.

However, in the present invention, a layer is formed on the first electrode using a metal having the higher oxidation rate than the first electrode before forming an organic material layer, to reduce or remove the native oxide layer formed on a first electrode in the production process of a device. It will be more specifically described as follows.

In the invention, the oxidation rate means the degree of increase in the oxygen content after reacting with oxygen, relative to that before reacting with oxygen. In the case where a layer is formed on the first electrode using a metal having the higher oxidation rate than the first electrode, as described above, the layer is substantially formed on a native oxide layer formed on the first electrode. At this time, in the interface between the native oxide layer and the layer formed on the native oxide layer, an oxidation-reduction reaction is occurred as following:

[Reaction Scheme]

$$M_xO_y + yR \rightarrow xM + yRO$$

wherein M is the type of metal used for forming a first electrode, R is the type of metal used for forming a layer on a first electrode, which is the metal having the higher oxidation rate than the metal used for forming a layer on the first electrode, and x and y are each a molar ratio.

That is, if a layer is formed on a native oxide layer formed on the first electrode using a metal having the higher oxidation rate than the first electrode, the native oxide layer reacts with the metal having the higher oxidation rate than the metal forming the first electrode. According to the reaction, as shown in FIG. 3, a metal layer is newly formed, instead of a native oxide layer associated with the first electrode formed on the first electrode, and the metal oxide layer is formed of a metal having the higher oxidation rate than the first electrode thereon, instead of a metal layer having the higher oxidation rate than the first electrode.

Figure 3:
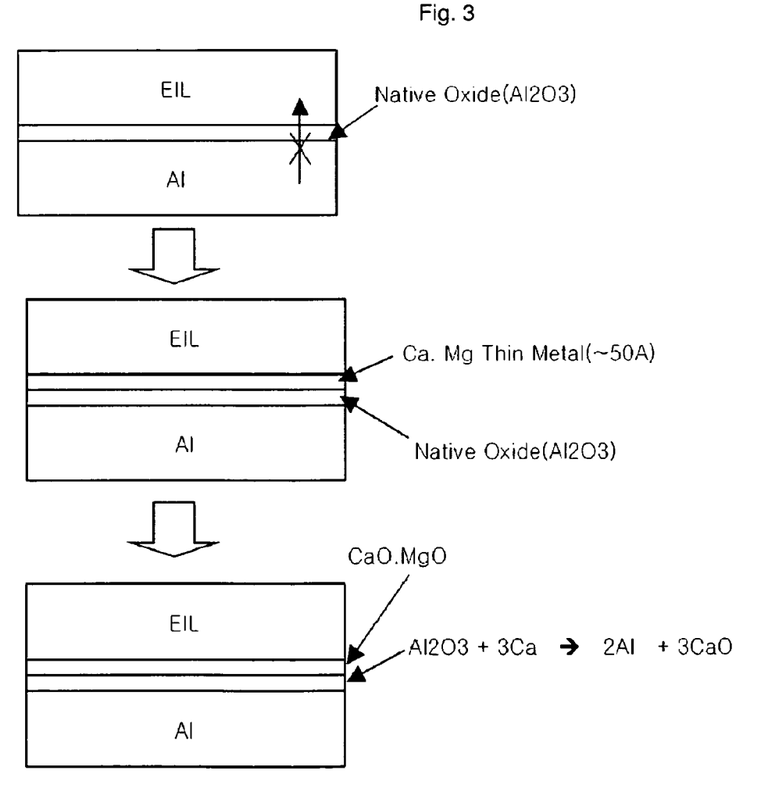
FIG. 3 illustrates a process of forming an additional layer in the organic light emitting device according to one embodiment of the invention.

Specifically, the organic light emitting device illustrated in FIG. 3 has a reverse structure, in which the first electrode is a cathode comprising Al. And a native oxide layer formed on the first electrode is aluminum oxide ($Al_2O_3$). A thin film is deposited on the aluminum oxide layer using Ca. At this time, the thin film formed using Ca is preferably 1 to 10 nm. The Ca reacts with $Al_2O_3$ as follows:

$$Al_2O_3 + Ca \rightarrow 2Al + 3CaO$$

As illustrated in FIG. 3, two layers are newly formed by the reaction between the two materials, thereby improving an electron injecting property of an organic light emitting device.

According to the above principles, in the present invention, a native oxide layer on a first electrode formed of a metal is removed or reduced, without additional equipment for processing and generating the current leakage from the side, to improve an electron injecting property or a hole injecting property of the first electrode formed of a metal. Therefore, the organic light emitting device according to the invention has an excellent electron or hole injecting efficiency, as well as an excellent light emitting property, lifetime characteristics or the like.

It is preferable that a metal having the higher oxidation rate than the first electrode has, but not limited thereto, an oxide formation energy ($\Delta_f H°$), which is greater than the MgO formation energy, −635.09 kJ/mol.

Examples of the metal having the higher oxidation rate than the first electrode include alkali metals, alkaline earth metals, and a mixture thereof, in particular, Ca, Mg, Ca/Ag, Mg/Ag, and the like. Since Li is unstable in air, it is difficult to deposit. However, in the case of using a method being able to stably deposit Li, Li can be used.

With reference to Table 1 showing an example of thermodynamic data of alkali metal oxide and alkaline earth metal oxide, the alkali metals, the alkaline earth metals, or a mixture thereof can prevent a native oxide layer from forming by taking oxygen on the surface of a first electrode formed of the metal due to its strong oxidizing power, and reduce or remove a native oxide layer by reacting with the native oxide layer formed.

TABLE 1

| Material (phase) | $\Delta_f H°$ (kJ/mol) | S° (J/mol * K) |
|---|---|---|
| MgO (s) | −635.09 | 26.85 |
| CaO (s) | −601.24 | 38.19 |
| SrO (s) | −592.04 | 55.42 |
| BaO (s) | −548.10 | 72.05 |
| $Li_2O$ (s) | −598.73 | 37.85 |
| $Na_2O$ (s) | −417.98 | 75.04 |
| $K_2O$ (s) | −363.17 | 94.03 |
| $Cs_2O$ (g) | −92.05 | 318.08 |

A layer formed by using a metal having the higher oxidation rate than the first electrode can be formed by using a method such as a thermal evaporation, a sputtering, an e-beam evaporation, an ion beam evaporation, but not limited thereto. For the specific example, a layer formed by using a metal having the higher oxidation rate than the first electrode can be formed by a vacuum thermal evaporation at about $10^{-7}$ torr and a temperature in the range of 600° C. to 900° C. for 10 to 20 sec. But, in this case, the electrode that the metal is deposited maintains preferably at normal temperature. Further, as described above, after forming a layer using a metal having the higher oxidation rate than the first electrode, even if the layer changes to be an oxide layer, the material forming the layer has to be the metal itself having the higher oxidation rate than the first electrode. If the layer is formed by using a metal oxide, the effects according to the above principles cannot be obtained.

The layer formed by using a metal having the higher oxidation rate than the first electrode can include at least one sub-layer.

The layer formed by using a metal having the higher oxidation rate than the first electrode is formed in a thin thickness, preferably 1 to 10 nm. In the above range, a native oxide layer, which prevents an electron or hole injection, can be effectively reduced or removed. Like this, a metal having the higher oxidation rate than the first electrode forming a layer with a thickness of several nanometers may react partially or entirely with a native oxide layer on the first electrode formed of the metal, or may form an oxide by reacting with the surrounding air or moisture.

In addition, the layer formed by using a metal having the higher oxidation rate than the first electrode is treated with oxygen plasma, which may change the metal having the higher oxidation rate than the first electrode into an oxide.

The metal oxide of a metal having the higher oxidation rate than the first electrode functions to change an energy level of the surface of the first electrode, thereby making an electron or hole injection easy by tunneling.

In general, it is known that the current leakage between the adjacent pixels in an organic light emitting device is not preferable. According to one embodiment of the invention, a layer formed by using a metal having the higher oxidation rate than the first electrode is formed only on the selective region of the first electrode using a shadow mask, the layer connected to a pixel not to connect with the adjacent pixels, thereby avoiding the current leakage from the side.

In an active matrix organic light emitting device, pixels can be separated to the side by the insulation. According to the invention, as described above, in the case where a layer is formed only on the selective region of the first electrode using a shadow mask, the layer is not extended over the side insulation between the adjacent pixels, thereby avoiding the current leakage from the side.

An organic light emitting device may be produced by a known method in the related art, with a first electrode, one or more organic material layers including a light emitting and a second electrode using the known materials, except that a layer formed by using a metal having the higher oxidation rate than a first electrode is placed between the first electrode and an organic material layer.

The organic light emitting device according to the invention may be of a top emission type, a bottom emission type, or a dual emission type. In particular, it is preferable that the organic light emitting device is of a top emission type or a dual emission type.

The first electrode may be formed of at least one metal layer. Examples of the metal used for forming the first electrode include, but not limited thereto, aluminum, molybdenum, chromium, magnesium, calcium, sodium, potassium, titanium, indium, yttrium, lithium, gadolinium, silver, tin, lead or alloy thereof. Among them, an aluminum electrode with a relatively high reflectivity (>50%) is more preferable. The metal materials may be deposited on a substrate by a deposition method such as thermal evaporation or sputtering. And also, it may be formed to be an electrode by patterning by the known method in the related art, such as photolithography and etching.

The second electrode may be formed of transparent conductive materials. Like in the first electrode, the second electrode may be formed of at least one layer. In the case where the organic light emitting device according to the invention is a top emission type or a dual emission type, the second electrode has to transmit light, whereby transparent materials with a low reflectivity, for example, indium tin oxide (ITO) or indium zinc oxide (IZO), are generally used as the materials for the second electrode.

The organic material layer may be a monolayered structure or a multilayered structure comprising at least two layers, depending on the type of an organic material. That is, in the case of using an organic material having a hole and electron transporting property, as well as a light emitting property, the organic material layer may be formed in a monolayered structure. Meanwhile, at least two organic material layers formed of an organic material having at least one property of a hole injecting, a hole transporting, a light emitting, an electron transporting, and an electron injecting property is deposited to produce a multilayered structure. The organic material layer may further comprise an electron injecting layer or a hole injecting layer, in addition to a light emitting layer. Among these layers, one layer may be formed on the layer formed by using a metal having the higher oxidation rate than the first electrode.

The organic material layer may be formed of an organic material including imidazole, oxazole and thiazole. The organic material layer may be formed by depositing an organic material with a metal having a low work function, such as Li, Cs, Na, Mg, Sc, Ca, K, Ce, Eu. Alkali metal fluoride may be effectively employable for the electron injecting layer. Lithium fluoride (LiF) is more preferable because of its excellent electron injecting property.

The organic material layer can be prepared by means of a solvent process rather than a deposit process, such as spin coating, dip coating, doctor blading, screen printing, ink jet printing, and heat transfer processes.

The organic light emitting device according to the invention may be a forward structure in which a first electrode is an anode, a second electrode is a cathode. In this case, a hole injecting property of the device can be improved by a layer formed between the first electrode and the organic material layer. Further, the organic light emitting device according to the invention may be a reverse structure in which a first electrode is a cathode, a second electrode is an anode. In this case, an electron injecting property of the device can be improved by a layer formed between the first electrode and the organic material layer.

Figure 4:
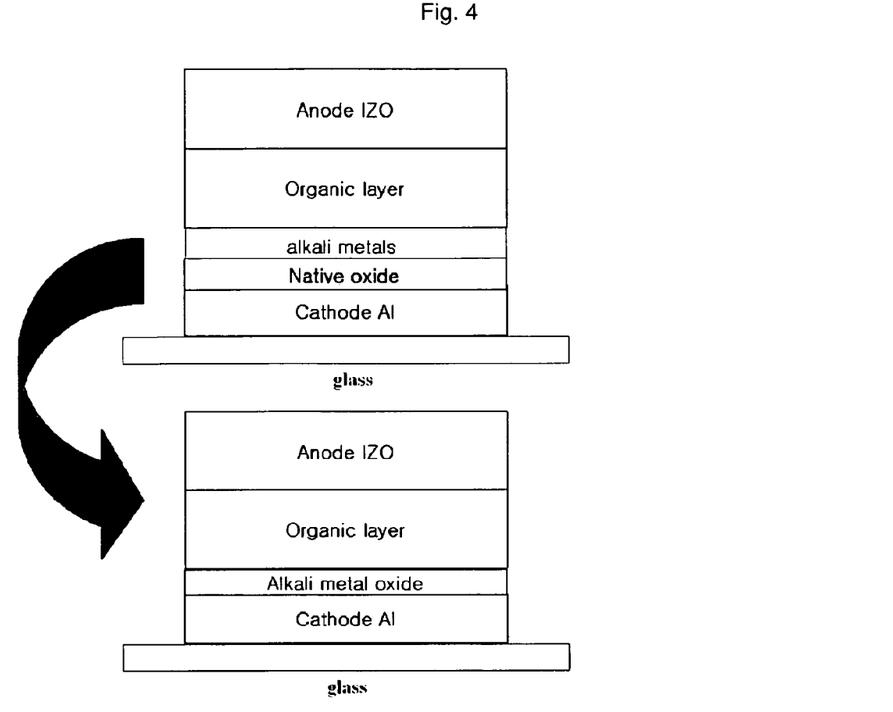
FIG. 4 is a cross-sectional diagram illustrating an organic light emitting device having a reverse structure according to one embodiment of the invention.

An example of the device having a reverse structure of the organic light emitting devices according to the invention is illustrated in FIG. 4.

With reference to FIG. 4, a cathode is formed by depositing aluminum on a transparent glass substrate using sputtering or thermal evaporation. And then, a native oxide ($Al_2O_3$) layer is formed on the aluminum electrode during a photoresistor process and an etching process, whereby electron injecting efficiency is decreased. On the aluminum electrode on which the native oxide layer is formed, a metal having the higher oxidation rate than the first electrode, such as alkali metal, alkaline earth metal or a mixture thereof, is deposited by sputtering or thermal evaporation or the like. An organic material layer, such as an electron injecting layer, an electron transporting layer, a light emitting layer, a hole transporting layer, and a hole injecting layer, is formed thereon. A transparent anode material, in addition to IZO (Indium Zinc Oxide) used as the second electrode, is deposited thereon to produce an organic light emitting device. Like this, an organic light emitting device can be produced in a reverse structure (inverted structure; top emission), in which on a substrate, a cathode, a layer formed using alkali metal, alkaline earth metal, or a mixture thereof, an organic material layer and an anode are staked in this order. Moreover, an organic light emitting device can be also produced in a forward structure, in which on a substrate, an anode, a layer formed using alkali metal, alkaline earth metal, or a mixture thereof, an organic material layer and a cathode are staked in this order.

Mode for the Invention

Hereinbelow, an organic light emitting device and a method for producing the same of the present invention will be described in detail with reference to the Examples. However, the Examples will be provided for the purpose of illustrating the present invention, and thus, the scope of the present invention is not limited thereto.

EXAMPLE 1

Production of Organic Light Emitting Device

On a glass substrate, an aluminum electrode layer was formed to a thickness of 150 nm by a photoresistor and etching, and on the formed electrode layer, calcium (Ca) was coated by thermal vacuum deposition under $10^{-7}$ torr and inert gas ($N_2$ or Ar) atmosphere at 700° C. for 10 sec to form a layer having a thicknesses of 2 nm. Subsequently, a LiF layer is formed on the layer to a thickness of 1.5 nm and an electron transporting layer (the following electron transporting material), a light emitting layer ($Alq_3$), a hole transporting layer (NPB; 4,4'-bis[N-(1-naphtyl)-N-phenylamino] biphenyl), and a hole injecting layer (the following hole injecting material (hexanitrile hexaazatriphenylene, HAT)) as an organic material layer can be sequentially stacked thereon in a thickness of 20 nm, 30 nm, 40 nm, and 50 nm, respectively. Then, a transparent IZO electrode as a hole injecting electrode is formed on the above organic material layer by sputtering to a thickness of 150 nm to produce an organic light emitting device.

[Electron Transporting Material]

[Hole Injecting Material]

EXAMPLE 2

Production of Organic Light Emitting Device

An organic light emitting device was produced in the same manners as Example 1, except treating with $O_2$ plasma after coating with calcium. The schematic representation of the plasma device and the operation conditions are as follows.

A glow discharge plasma device (RF-5S, manufactured by Advanced energy), which is a capacitively-coupled model using audio frequency (1 to 12 kHz) at normal pressure, was used. That is, voltage of 7.5 kVrms is applied between two parallel electrodes (space=3.5 cm). At first, under the plasma frequency of 5.0 kHz, helium gas of 13 lpm (liter per minute)

is continuously injected into plasma chamber, to maintain in the stable state of the plasma. In this state, oxygen ($O_2$) of 0.2 lpm is injected to oxidize the layer formed by calcium. The treatment time is 3 minutes.

EXAMPLE 3

Production of Organic Light Emitting Device

An organic light emitting device was produced in the same manners as Example 1, except using magnesium (Mg) instead of Ca.

EXAMPLE 4

Production of Organic Light Emitting Device

An organic light emitting device was produced in the same manners as Example 1, except using Ca/Mg (5:5) instead of Ca.

EXAMPLE 5

Production of Organic Light Emitting Device

An organic light emitting device was produced in the same manners as Example 1, except that deposited using cesium (Cs), instead of Ca, to a thickness of 1.5 nm.

COMPARATIVE EXAMPLE 1

Production of Organic Light Emitting Device

An organic light emitting device was produced by stacking an electron injecting layer (LiF), an organic material layer, and a transparent IZO anode in this order, not forming a layer using Ca on the aluminum electrode.

COMPARATIVE EXAMPLE 2

Production of Organic Light Emitting Device

An organic light emitting device was produced in the same manners as Example 1, except forming a layer by depositing CaO directly on the aluminum electrode, not forming a layer using Ca on the aluminum electrode.

COMPARATIVE EXAMPLE 3

Production of Organic Light Emitting Device

An organic light emitting device was produced in the same manners as Example 1, except forming a layer by depositing MgO directly on the aluminum electrode, not forming a layer using Ca on the aluminum electrode.

EXPERIMENTAL EXAMPLE

In order to compare the effects of removing a native oxide layer, in the case of forming a layer on a metal electrode using a metal having the higher oxidation rate than the electrode, and in the case of forming a layer using a metal oxide, an electron injecting property, a light emitting property and lifetime characteristics of the organic light emitting device according to Example 1 to 4 and Comparative Example 1 to 3 are measured under the following conditions.

1. Test on Electron Injecting Property

In order to confirm only an electron injecting property, an electron injecting property was confirmed by a device having the structure of an aluminum electrode at a lower portion/a layer formed using a metal (Example) or a metal oxide (Comparative Example)/an electron transporting layer/an electron injecting layer/an IZO electrode at an upper portion.

2. Luminance Property

Luminance of the organic light emitting devices produced in Example 1 to 4 and Comparative Example 1 to 3 was measured with PR650 colorimeter/radiometer manufactured by Photo-Research and luminance according to the current change (10 $mA/cm^2$ to 100 $mA/cm^2$) was also measured.

3. Lifetime Property

The Lifetime of the organic light emitting devices produced in Example 1 to 4 and Comparative Example 1 to 3 was measured with lifetime measurement system to measure luminance, voltage or the like under the predetermined current (at 50 $mA/cm^2$).

The results were summarized in the following Table 2.

TABLE 2

| | Quantum efficiency (%) | Voltage (V) | Luminance (cd/$m^2$) | Lifetime (hour) |
|---|---|---|---|---|
| Example 1 | 4.5 | 6.5 | 10,077 | 800 |
| Example 2 | 4.1 | 7.8 | 5,120 | 200 |
| Example 3 | 3.5 | 6.3 | 2,220 | 1,000 |
| Example 4 | 3.8 | 6.7 | 3,605 | 1,000 |
| Comparative Example 1 | 2.1 | 12.5 | 2,100 | 300 |
| Comparative Example 2 | 3.8 | 7.8 | 7,200 | 500 |
| Comparative Example 3 | 3.2 | 7.5 | 6,820 | 550 |

As shown in the Table 2, an electron injecting property, driving voltage and lifetime characteristics of the organic light emitting devices according to Example 1 to 4 were improved, as compared with Comparative Example 1 to 3. Therefore, it is found that a native oxide layer on an aluminum electrode was effectively removed.

Figure 5:
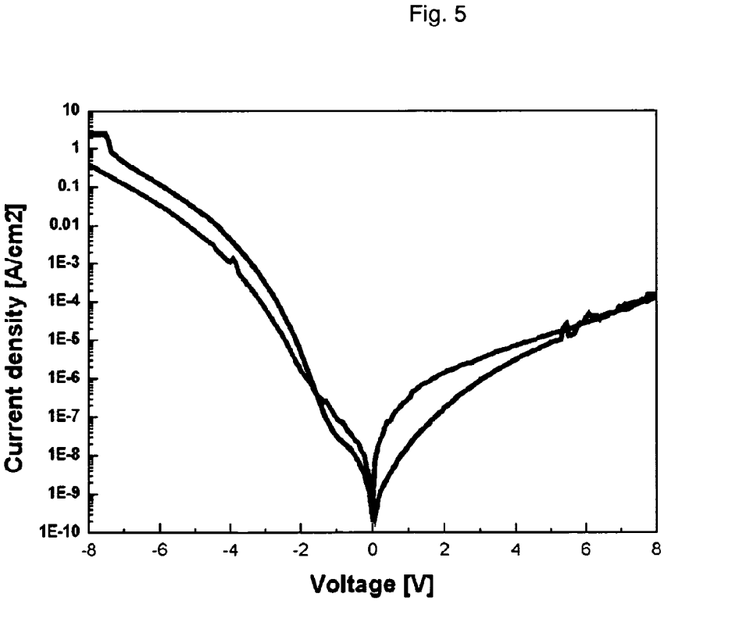
FIGS. 5 to 7 illustrate a current-voltage characteristic of the organic light emitting device according to Comparative Example 1, Example 1 and Example 5.
Figure 6:
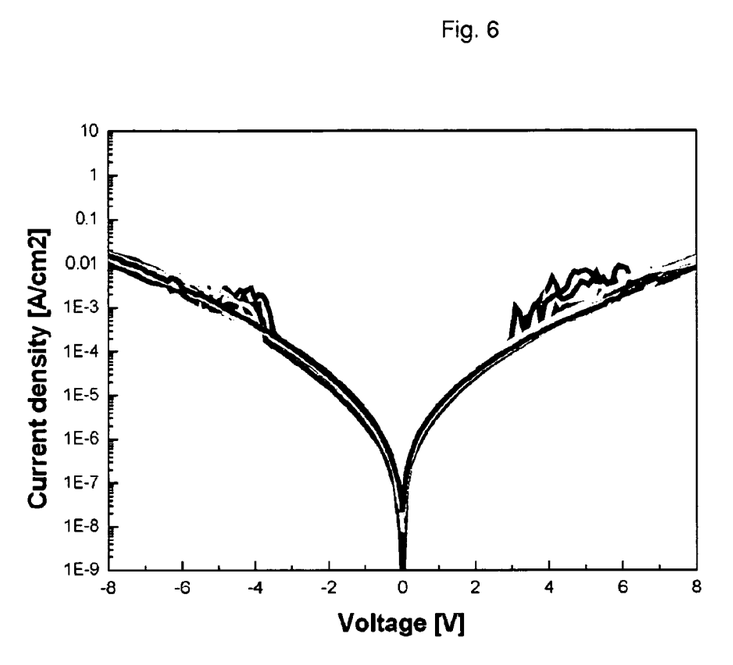
Figure 7:
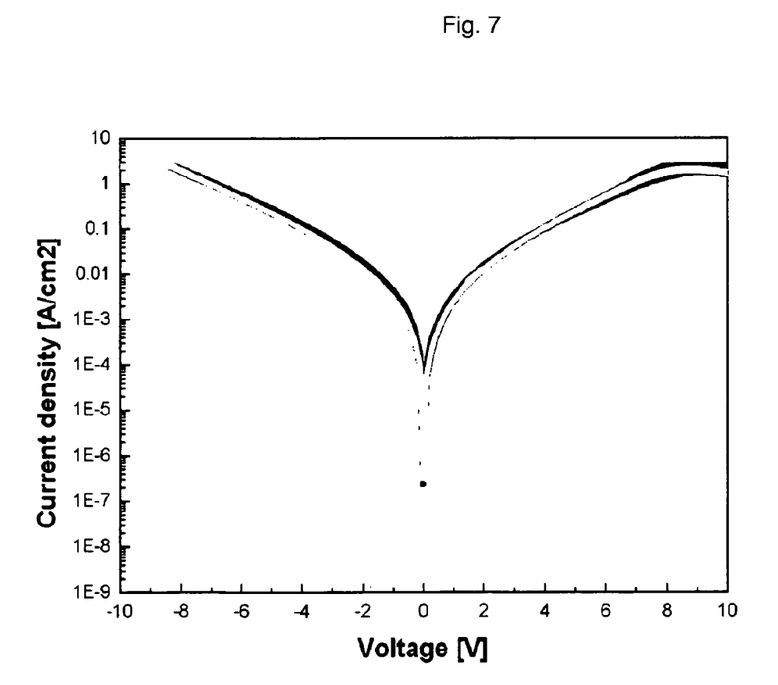
Figure 8:
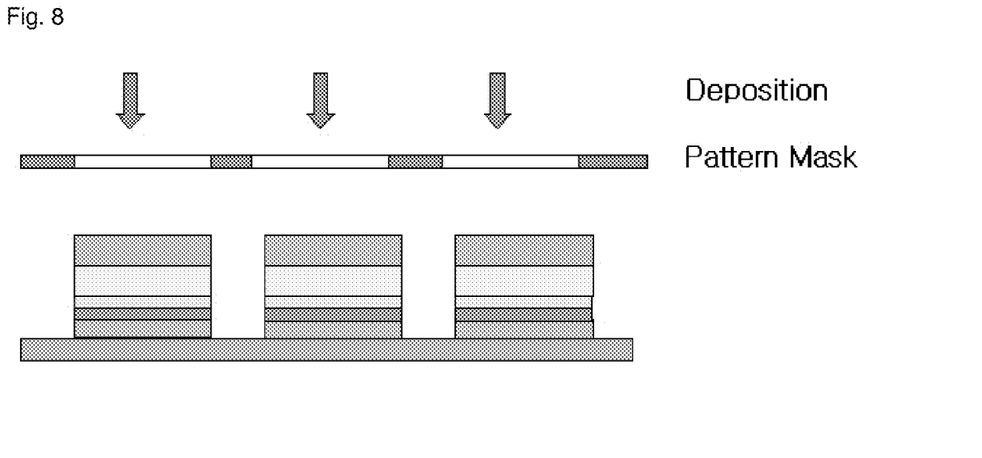
FIG. 8 illustrates a process of forming a layer on the selective region by using a shadow mask.
Figure 9:
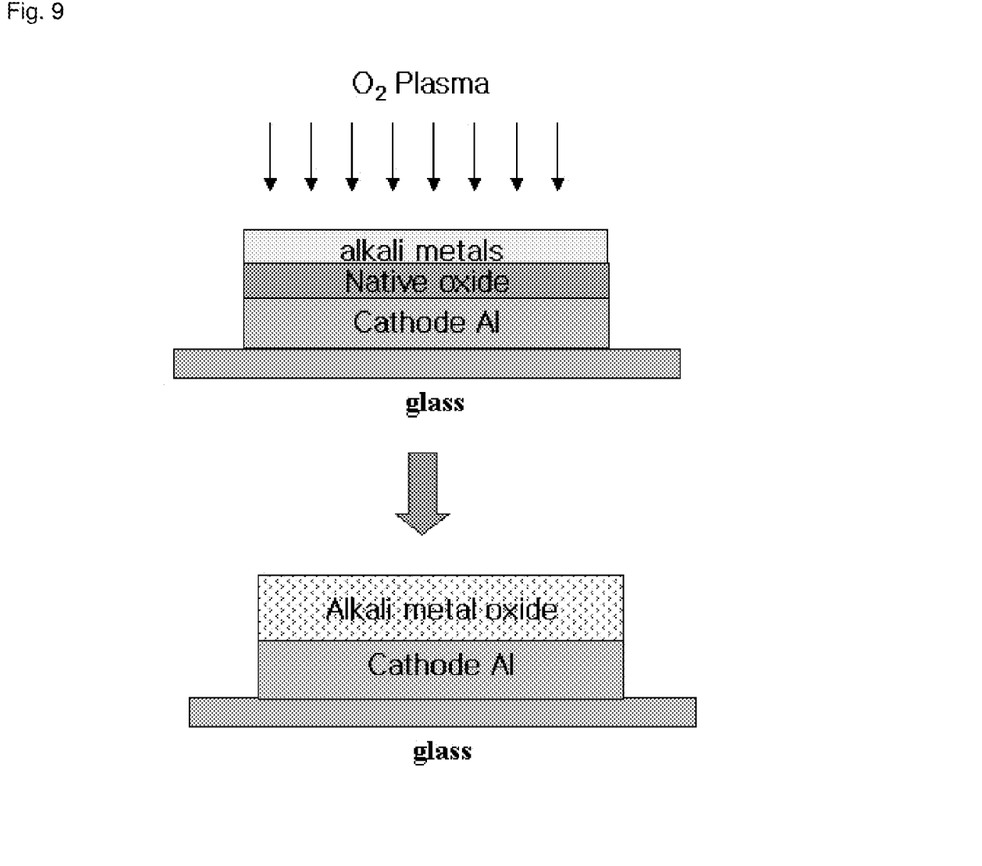
FIG. 9 illustrates a process of treating a layer with oxygen plasma.

Meanwhile, the current-voltage characteristics of the organic light emitting device according to Comparative Example 1 (native oxide film), Example 1 (Ca 2 nm) and Example 5 (Cs 1.5 nm) are shown in FIGS. 5 to 7. As shown in FIG. 5, in the case where a native oxide layer ($Al_2O_3$) is formed on an electrode at lower portion, the current-voltage characteristic is presented asymmetrically, and the presence of a native oxide layer prevents an electron injection to decrease the amount of current in the positive voltage region. On the other hand, as shown in FIGS. 6 and 7, in the case of forming an alkaline earth metal layer and an alkali metal layer, the current-voltage characteristic is presented symmetrically and the current disturbance due to the native oxide layer is not generated.

The invention claimed is:

1. A method to reduce or remove a native oxide on a cathode in an organic light emitting device, comprising:
    forming on a substrate the cathode, the cathode comprising a first metal and the native oxide layer of the first metal,
    forming a layer comprising a second metal directly in contact with the native oxide, by a vacuum thermal evaporation, on the native oxide layer of the first metal and introducing oxygen plasma, such that the second metal and the native oxide layer of the first metal react to form a metal oxide layer of the second metal on the cathode, wherein the second metal has a higher oxidation rate than the first metal, and forming one or more organic material layers including a light emitting layer, and an anode on the metal oxide layer, wherein first metal is selected from the group consisting of aluminum, molybdenum, chromium, magnesium, calcium, sodium, potassium, titanium, indium, yttrium, lithium, gadolinium, silver, tin, lead and an alloy thereof;

wherein the second metal is selected from the group consisting of calcium, magnesium, a calcium and silver mixture, a magnesium and silver mixture, and a calcium and magnesium mixture;

wherein the thickness of the metal oxide layer is 1 to 10 nm; and wherein one of the organic material layers is an electron injecting layer in contact with the metal oxide layer.

2. The method according to claim 1, wherein the organic light emitting device is of a top emission type or of a dual emission type.

3. The method according to claim 1, wherein upon forming the layer comprising the second metal, the layer is selectively formed on the cathode by using a shadow mask.

* * * * *